(12) United States Patent
Jung et al.

(10) Patent No.: US 9,806,275 B2
(45) Date of Patent: Oct. 31, 2017

(54) ORGANIC LIGHT EMITTING DIODE DISPLAY

(71) Applicant: SAMSUNG DISPLAY CO., LTD., Yongin, Gyeonggi-Do (KR)

(72) Inventors: Seung-Ho Jung, Hwaseong-si (KR); Chaun Gi Choi, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 98 days.

(21) Appl. No.: 14/701,879

(22) Filed: May 1, 2015

(65) Prior Publication Data

US 2016/0141540 A1 May 19, 2016

(30) Foreign Application Priority Data

Nov. 17, 2014 (KR) ........................ 10-2014-0160204

(51) Int. Cl.
| | | |
|---|---|---|
| *H01L 51/50* | (2006.01) | |
| *H01L 51/00* | (2006.01) | |
| *H01L 51/52* | (2006.01) | |
| *H01L 27/32* | (2006.01) | |

(52) U.S. Cl.
CPC ...... *H01L 51/5036* (2013.01); *H01L 27/3244* (2013.01); *H01L 51/52* (2013.01); *H01L 2251/5369* (2013.01)

(58) Field of Classification Search
CPC ............. H01L 51/5036; H01L 51/0096; H01L 51/5253; H01L 51/50; H01L 51/52; H01L 51/00
USPC .......................................................... 257/40
See application file for complete search history.

(56) References Cited

U.S. PATENT DOCUMENTS

| | | | | |
|---|---|---|---|---|
| 9,599,857 | B2 * | 3/2017 | Bibl ................. | G02F 1/133617 |
| 2008/0238829 | A1 * | 10/2008 | Kane .................... | H01L 27/3213 345/76 |
| 2008/0246388 | A1 * | 10/2008 | Cheon ...................... | G02F 2/02 313/501 |
| 2008/0284313 | A1 * | 11/2008 | Berben ............... | H01L 51/5036 313/501 |
| 2010/0172122 | A1 * | 7/2010 | Ramer ...................... | F21K 9/00 362/84 |
| 2010/0219429 | A1 * | 9/2010 | Cok ....................... | H01L 27/322 257/89 |

(Continued)

FOREIGN PATENT DOCUMENTS

| | | |
|---|---|---|
| KR | 10-2009-0127291 A | 12/2009 |
| KR | 10-1237124 B1 | 2/2013 |
| KR | 10-2013-0141963 A | 12/2013 |

OTHER PUBLICATIONS

Chen, et al. "Quantum-dot displays : Giving LCDs a competitive edge through color", Information Display, vol. 29/pp. 12-17, 2013.

(Continued)

*Primary Examiner* — Alexander Oscar Williams
(74) *Attorney, Agent, or Firm* — Lee & Mose, P.C.

(57) ABSTRACT

An organic light emitting diode display, including a substrate; an organic light emission display layer on the substrate; and a quantum dot layer on the organic light emission display layer, the substrate representing a color of a first wavelength range, and the quantum dot layer color-shifting the color of the first wavelength range to form a transparent light passing through the quantum dot layer.

4 Claims, 6 Drawing Sheets

(56) References Cited

U.S. PATENT DOCUMENTS

| | | | |
|---|---|---|---|
| 2010/0224859 A1 | 9/2010 | Gough et al. | |
| 2014/0291495 A1* | 10/2014 | Fischer | C08L 69/00 250/216 |
| 2014/0367633 A1* | 12/2014 | Bibl | G02F 1/133603 257/13 |
| 2015/0002528 A1* | 1/2015 | Bohn | G02B 27/0172 345/589 |
| 2015/0125829 A1* | 5/2015 | Hyman | B44C 3/046 434/81 |
| 2015/0287927 A1* | 10/2015 | Okubo | B82Y 20/00 257/40 |
| 2016/0091640 A1* | 3/2016 | Wu | G02B 5/201 359/891 |
| 2016/0254474 A1* | 9/2016 | Zou | H01L 51/5221 257/40 |
| 2016/0258583 A1* | 9/2016 | Shi | F21K 9/56 |
| 2017/0076678 A1* | 3/2017 | Lee | G09G 3/2003 |

OTHER PUBLICATIONS

Lee, et al. "Quantum-dot-based white lighting planar source through downconversion by blue electroluminescence", Optics Letters, vol. 39/pp. 1208-1211, 2014.

\* cited by examiner

ORGANIC LIGHT EMITTING DIODE DISPLAY

CROSS-REFERENCE TO RELATED APPLICATION

Korean Patent Application No. 10-2014-0160204, filed on Nov. 17, 2014, in the Korean Intellectual Property Office, and entitled: "Organic Light Emitting Diode Display," is incorporated by reference herein in its entirety.

BACKGROUND

1. Field

The present disclosure relates to an organic light emitting diode display.

2. Description of the Related Art

An organic light emitting display may include a plurality of organic light emitting diodes and may be formed of a hole injection electrode, an organic emission layer, and an electron injection electrode. Each organic light emitting diode may emit light by energy which may be generated when an electron and a hole are coupled to each other in the organic emission layer to generate an exciton and the exciton is changed from an excited state into a base state.

SUMMARY

Embodiments may be realized by providing an organic light emitting diode display, including a substrate; an organic light emission display layer on the substrate; and a quantum dot layer on the organic light emission display layer, the substrate representing a color of a first wavelength range, and the quantum dot layer color-shifting the color of the first wavelength range to form a transparent light passing through the quantum dot layer.

The quantum dot layer may represent a color of a second wavelength range.

The first wavelength range may be 570 nm to 590 nm, and the second wavelength range may be 450 nm to 495 nm.

The substrate may include a colored polymer.

The quantum dot layer may include a quantum dot particle that includes Cd, Se, Zn, or S.

The quantum dot particle may have a diameter of less than 2 nm.

The organic light emitting diode display may further include a protection layer on the quantum dot layer, the protection layer protecting the quantum dot layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
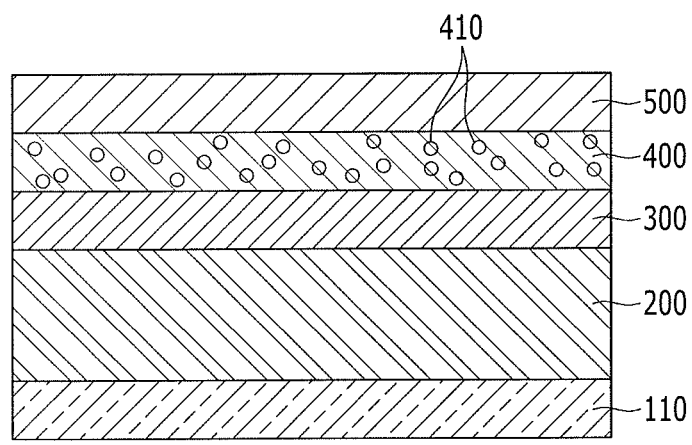
FIG. 1 illustrates a schematic sectional view of an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In order to clarify the present disclosure, parts that are not connected with the description will be omitted, and the same elements or equivalents are referred to by the same reference numerals throughout the specification.

The size and thickness of each element are arbitrarily shown in the drawings, and the present disclosure is not necessarily limited thereto, and in the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the accompanying drawings, an active matrix (AM) type of organic light emitting diode (OLED) display may be illustrated to have, for example, a 2Tr-1Cap structure in which two transistors (TFTs) and one capacitor are provided for one pixel. In the OLED display, each pixel may be provided with a plurality of transistors and at least one capacitor, and may be formed to have various structures by further forming additional wires or omitting existing wires. The pixel may be a minimum unit for displaying an image, and the OLED display may display the image through the plurality of pixels. The OLED display according to the exemplary embodiment will now be described in detail with reference to FIG. 1 to FIG. 6.

FIG. 1 illustrates a schematic sectional view of an organic light emitting diode display according to an exemplary embodiment.

As shown in FIG. 1, the organic light emitting diode display according to an exemplary embodiment may include a substrate 110, an organic light emission display layer 200, e.g., diode, formed on the substrate 110 and displaying an image, a thin film encapsulation layer 300 covering the organic light emission display layer 200, a quantum dot layer 400 formed on the thin film encapsulation layer 300, and a protection layer 500 formed on the quantum dot layer 400 and protecting the quantum dot layer 400 from the outside.

The substrate 110 may include a colored polymer showing, e.g., transmitting or representing, a color of a first wavelength range of 570 nm to 590 nm. The colored polymer may form a charge transfer complex (CTC), the substrate 110 including the colored polymer may have excellent heat resistance and mechanical characteristics, and the organic light emitting diode display applied with, e.g., including, the substrate 110 including the colored polymer may be processed at a process temperature of more than 450° C.

However, the substrate 110 including the colored polymer may have a yellow index in a 20-30 range, and it may be difficult to realize a transparent organic light emitting diode display.

A detailed structure of the organic display emission layer will be described with reference to FIG. 2 to FIG. 5.

Figure 2:
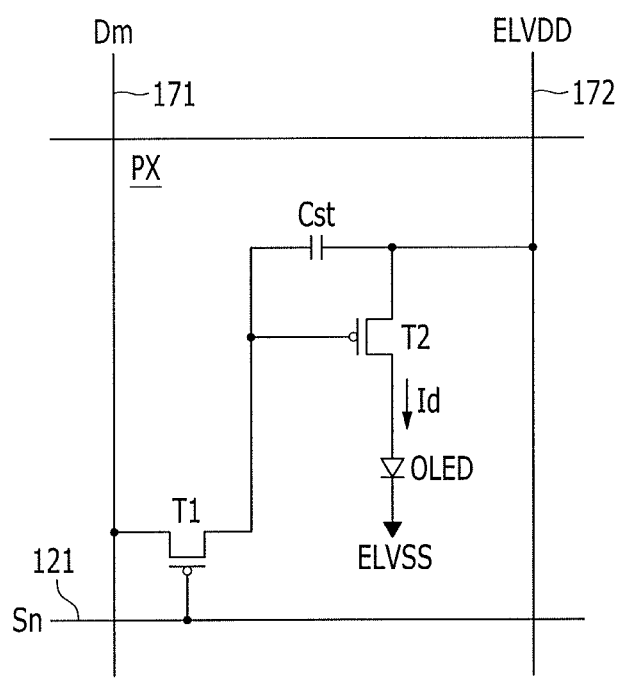
FIG. 2 illustrates an equivalent circuit diagram of one pixel formed in an organic light emission display layer of an organic light emitting diode display according to an exemplary embodiment.

FIG. 2 illustrates an equivalent circuit diagram of one pixel formed in an organic light emission display layer of an organic light emitting diode display according to an exemplary embodiment.

As shown in FIG. 2, one pixel PX formed in the organic light emission display layer 200 of the organic light emitting diode display according to an exemplary embodiment may include a plurality of signal line 121, 171, and 172, a plurality of transistor T1 and T2 connected to a plurality of signal lines, a storage capacitor (Cst), and an organic light emitting diode (OLED).

The transistors T1 and T2 may include a switching transistor T1 and a driving transistor T2.

The signal lines 121, 171, and 172 may include a plurality of scan lines 121 transmitting a scan signal Sn, a plurality of data lines 171 crossing the scan lines 121 and transmitting a data signal Dm, and a plurality of driving voltage lines 172 transmitting a driving voltage ELVDD and being almost parallel to the data lines 171.

The switching transistor T1 may have a control terminal, an input terminal, and an output terminal, and the control terminal may be connected to the scan line 121, the input terminal may be connected to the data line 171, and the output terminal may be connected to the driving thin film transistor T2. The switching thin film transistor T1 may transmit the data signal Dm applied to the data line 171 to the driving transistor T2 in response to the scan signal Sn applied to the scan line 121.

The driving transistor T2 also may have a control terminal, an input terminal, and an output terminal, and the control terminal may be connected to the switching transistor T1, the input terminal may be connected to the driving voltage line 172, and the output terminal may be connected to the organic light emitting diode OLED. The driving transistor T2 may flow, e.g., drive, a driving current Id having a magnitude that varies according to the voltage between the control terminal and the output terminal.

The storage capacitor Cst may be connected between, e.g., located between, the control terminal and the input terminal of the driving transistor T2. The storage capacitor Cst may charge the data signal applied to the control terminal of the driving transistor T2 and may maintain it after the switching transistor T1 is turned off.

The organic light emitting diode OLED may have an anode connected to the output terminal of the driving transistor T2 and a cathode connected to the common voltage ELVSS. The organic light emitting diode OLED may emit light by changing its intensity depending on an output current ILD, and an image may be displayed.

The switching transistor T1 and the driving transistor T2 may be n channel electric field effect transistors (FET) or p channel electric field effect transistors. The connection relation of the transistors T1 and T2, the storage capacitor Cst, and the organic light emitting diode OLED may be changed.

Next, the detailed structure of one pixel formed in the organic light emission display layer of the organic light emitting diode display according to an exemplary embodiment shown in FIG. 2 will be described with reference to FIG. 3 to FIG. 5 as well as FIG. 2.

Figure 3:
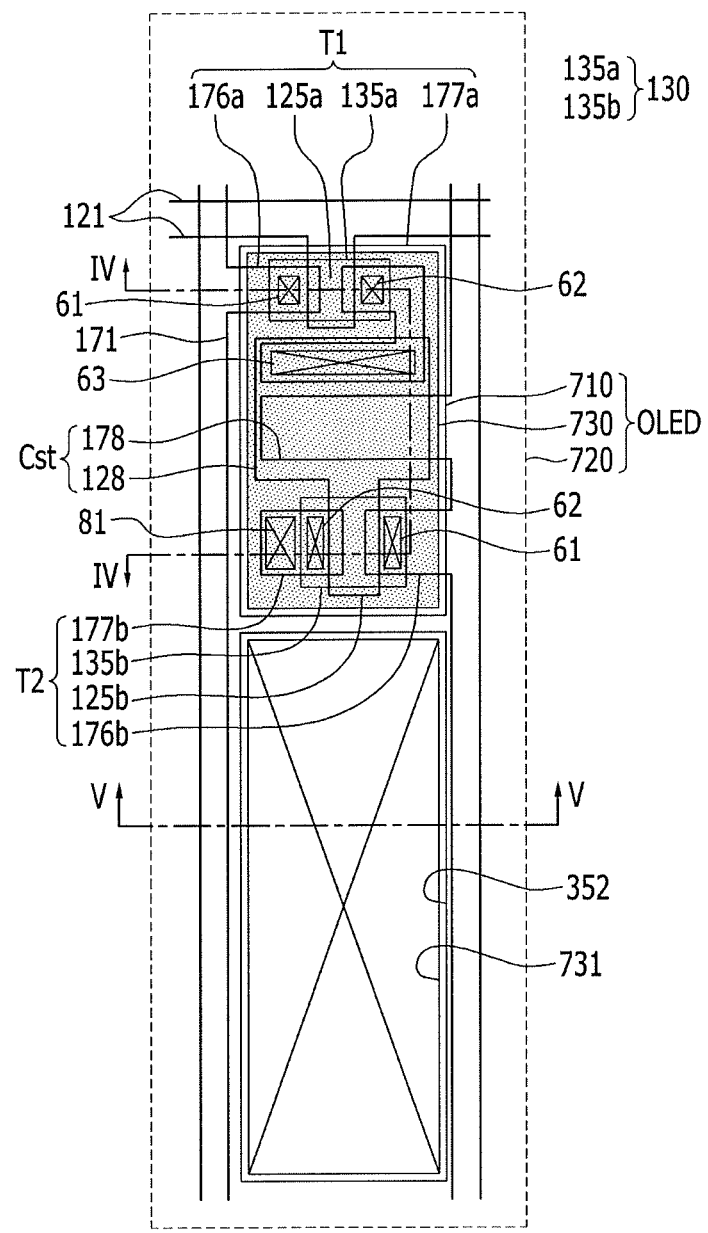
FIG. 3 illustrates an equivalent circuit diagram of one pixel formed in an organic light emission display layer of an organic light emitting diode display according to an exemplary embodiment.
Figure 4:
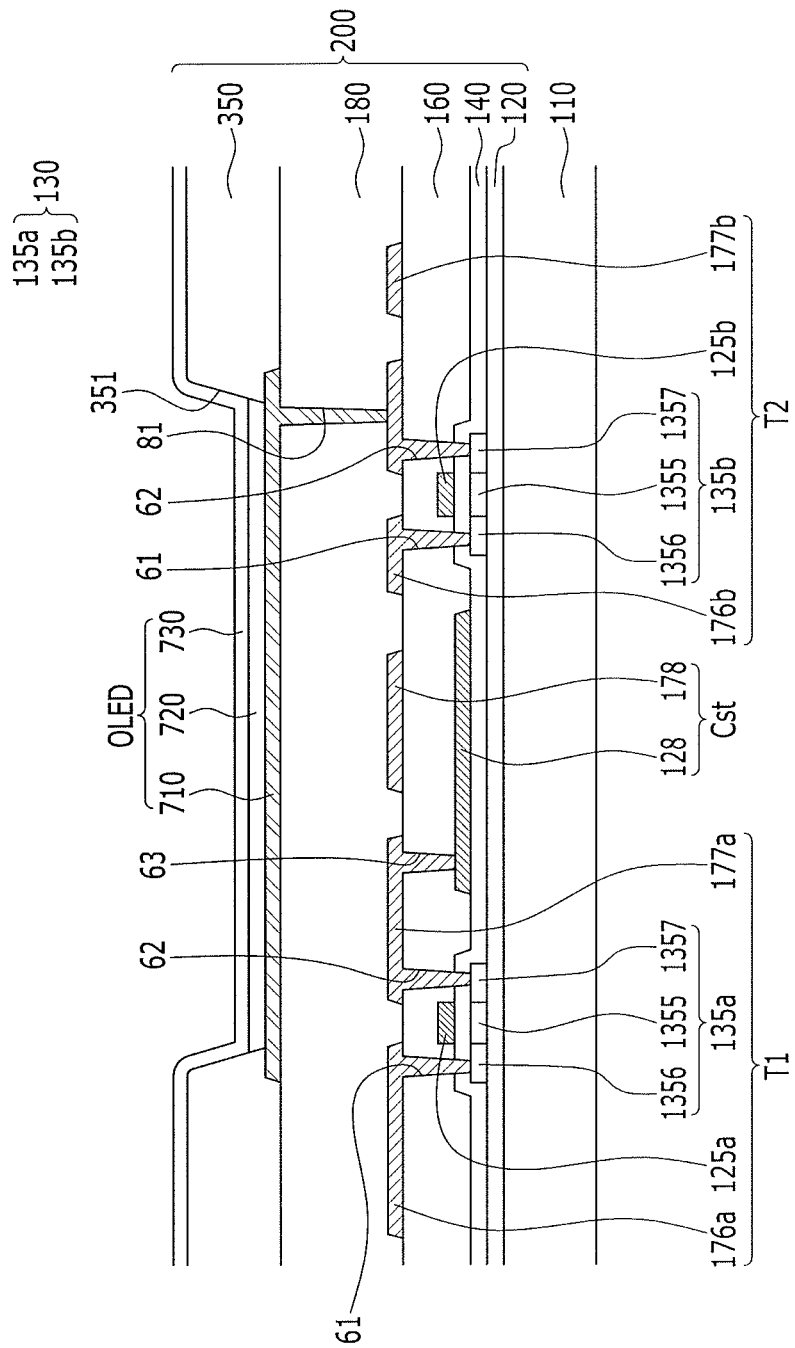
FIG. 4 illustrates a cross-sectional view taken along a line IV-IV of FIG. 3.
Figure 5:
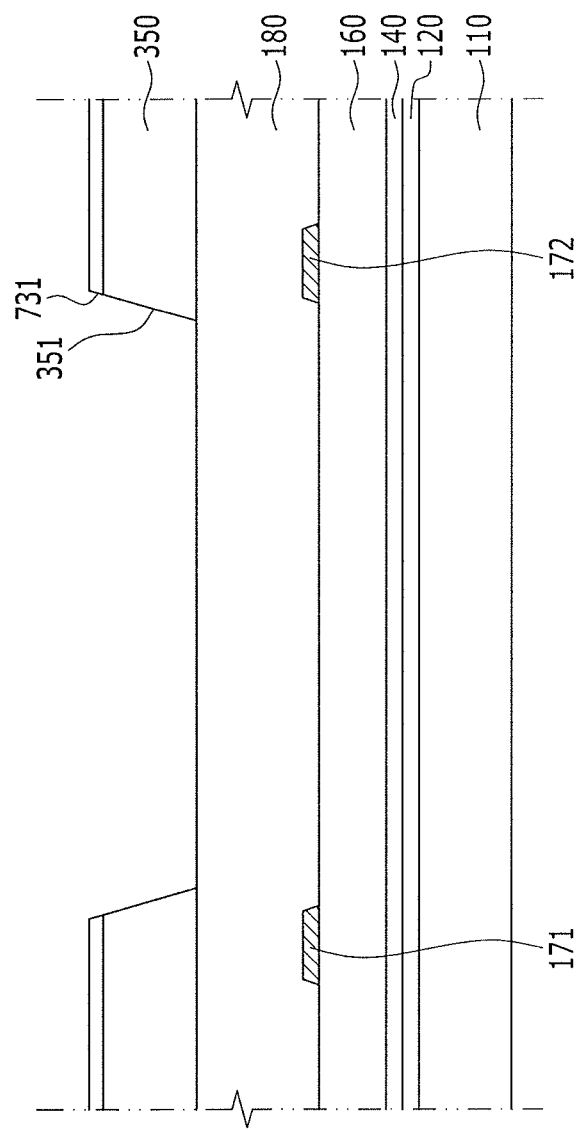
FIG. 5 illustrates a cross-sectional view taken along a line V-V of FIG. 3.

FIG. 3 illustrates an equivalent circuit diagram of one pixel formed in an organic light emission display layer of an organic light emitting diode display according to an exemplary embodiment, FIG. 4 illustrates a cross-sectional view taken along a line IV-IV of FIG. 3, and FIG. 5 illustrates a cross-sectional view taken along a line V-V of FIG. 3.

As shown in FIG. 3 to FIG. 5, the organic light emission display layer 200 of the organic light emitting diode display according to an exemplary embodiment may include a buffer layer 120 formed of the substrate 110. The buffer layer 120 may be formed of a single layer of a silicon nitride ($SiN_x$) or a dual-layer structure in which a silicon nitride ($SiN_x$) and a silicon oxide ($SiO_x$) are deposited. The buffer layer 120 may serve to planarize a surface while preventing unnecessary components such as an impurity or moisture from permeating, e.g., into the substrate 110.

A semiconductor 130 may be formed on the buffer layer 120. The semiconductor 130 may include a switching semiconductor 135a and a driving semiconductor 135b that are separated from each other. The semiconductors 135a and 135b may be made of a polycrystalline semiconductor material or an oxide semiconductor material. Exemplary oxide semiconductor materials include an oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide ($InGaZnO_4$), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which are compound oxides thereof. The semiconductor layer 130 may be made of the oxide semiconductor, a separate passivation layer may be added, and the oxide semiconductor that may be vulnerable to an external environment, such as a high temperature, may be protected.

The switching semiconductor 135a and the driving semiconductor 135b may respectively be divided into a channel 1355 and a source region 1356 and drain region 1357 respectively formed at both sides of the channel 1355. The channel 1355 of the switching semiconductor 135a and the driving semiconductor 135b may be channel-doped with a doping impurity of an N-type impurity or a P-type impurity, and the source region 1356 and the drain region 1357 of the switching may be contact-doped with a higher doping concentration of the doping impurity than with the channel doping.

A gate insulating layer 140 may be formed on the switching semiconductor 135a and the driving semiconductor 135*b*. The gate insulating layer 140 may be formed of the single layer or the multilayer including at least one of a silicon nitride and a silicon oxide.

A scan line 121, a driving gate electrode 125*b*, and a first storage capacitor plate 128 may be formed on the gate insulating layer 140. The scan line 121 may extend in the horizontal direction and may transmit the scan signal Sn, and may include a switching gate electrode 125*a* from the scan line 121 to the switching semiconductor 135*a*. The driving gate electrode 125*b* may protrude from the first storage capacitor plate 128 to the driving semiconductor 135*b*. The switching gate electrode 125*a* and the driving gate electrode 125*b* may respectively overlap the channel 1355.

An interlayer insulating layer 160 may be formed on the scan line 121, the driving gate electrode 125*b*, and the first storage capacitor plate 128. The interlayer insulating layer 160 may be formed of a silicon nitride or a silicon oxide like the gate insulating layer 140.

The interlayer insulating layer 160 and the gate insulating layer 140 may have a source contact hole 61 and a drain contact hole 62 respectively exposing the source region 1356 and the drain region 1357, and a storage contact hole 63 exposing a part of the first storage capacitor plate 128.

On the interlayer insulating layer 160, a data line 171 having a switching source electrode 176*a*, a driving voltage line 172 having a driving source electrode 176*b* and a second storage capacitor plate 178, a switching drain electrode 177*a* connected to the first storage capacitor plate 128, and a driving drain electrode 177*b* may be formed.

The data line 171 may transmit the data signal Dm and may extend in the direction crossing the gate line 121. The driving voltage line 172 may transmit the driving voltage ELVDD, may be separated from the data line 171, and may extend in the same direction.

The switching source electrode 176*a* may protrude from the data line 171 toward the switching semiconductor 135*a*, and the driving source electrode 176*b* may protrude from the driving voltage line 172 to the driving semiconductor 135*b*. The switching source electrode 176*a* and the driving source electrode 176*b* may respectively be connected to the source region 1356 through the source contact hole 61.

The switching drain electrode 177*a* may face the switching source electrode 176*a*, the driving drain electrode 177*b* may face the driving source electrode 176*b*, and the switching drain electrode 177*a* and the driving drain electrode 177*b* may respectively be connected to the drain region 1357 through the drain contact hole 62.

The source contact hole 61 exposing the source region 1356 and the drain contact hole 62 exposing the drain region 1357 may be formed in the gate insulating layer 140 and the interlayer insulating layer 160 together. The switching drain electrode 177*a* may extend and may be electrically connected to the first storage capacitor plate 128 and the driving gate electrode 125*b* through the storage contact hole 63 formed in the interlayer insulating layer 160.

The second storage capacitor plate 178 may protrude from the driving voltage line 171 and may overlap the first storage capacitor plate 128, and the first storage capacitor plate 128 and the second storage capacitor plate 178 may form the storage capacitor Cst using the interlayer insulating layer 160 as a dielectric material.

The switching semiconductor 135*a*, the switching gate electrode 125*a*, the switching source electrode 176*a*, and the switching drain electrode 177*a* may form the switching transistor T1, and the driving semiconductor 135*b*, the driving gate electrode 125*a*, the driving source electrode 176*b*, and the driving drain electrode 177*b* may form the driving transistor T2.

A passivation layer 180 may be formed on the switching source electrode 176*a*, the driving source electrode 176*b*, the switching drain electrode 177*a*, and the driving drain electrode 177*b*.

A pixel electrode 710 may be formed on the passivation layer 180, and the pixel electrode 710 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 may be electrically connected with the driving drain electrode 177*b* of the driving transistor T2 through a contact hole 81 formed in the interlayer insulating layer 160, and may become an anode of an organic light emitting diode OLED.

A pixel defining layer 350 may be positioned on the passivation layer 180 and an edge of the pixel electrode 710. The pixel defining layer 350 may have a pixel opening 351 exposing the pixel electrode 710 and a transmitting window 352 exposing the passivation layer 180. The pixel definition layer 180 may include a resin such as, for example, a polyacrylate or polyimide or a silica-based inorganic material.

An organic emission layer 720 may be formed in the pixel opening 351 of the pixel defining layer 350. The organic emission layer 720 may be formed as a multilayer including one or more of an emission layer, a hole-injection layer (HIL), a hole-transporting layer (HTL), an electron-transporting layer (ETL), and an electron-injection layer (EIL). The organic emission layer 720 may include all the layers, the hole-injection layer may be positioned on the pixel electrode 710 which may be an anode, and the hole-transporting layer, the emission layer, the electron-transporting layer, and the electron-injection layer may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer may be formed in a red pixel, a green pixel, and a blue pixel, respectively, and a color image may be implemented.

The organic emission layer 720 may implement the color image by laminating the red organic emission layer, the green organic emission layer, and the blue organic emission layer together in the red pixel, the green pixel, and the blue pixel, and forming a red color filter, a green color filter, and a blue color filter for each pixel. In an embodiment, white organic emission layers emitting white light may be formed in all of the red pixel, the green pixel, and the blue pixel, a red color filter, a green color filter, and a blue color filter may be formed for each pixel, and the color image may be implemented. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, may not be used.

The white organic emission layer described in an embodiment may be formed by one organic emission layer, and may include a configuration in which a plurality of organic emission layers are laminated to emit white light. For example, the white organic emission layer may include a configuration which may emit white light by combining at least one yellow organic emission layer and at least one blue organic emission layer, a configuration which may emit white light by combining at least one cyan organic emission layer and at least one red organic emission layer, or a configuration which may emit white light by combining at least one magenta organic emission layer and at least one green organic emission layer.

The transmitting window 352 may be formed with the wide area in the pixel to increase the external light transmittance, and an organic light emitting diode display may be transparently recognized.

A common electrode 730 may be formed on the pixel defining layer 350 and the organic emission layer 720. The common electrode 730 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/ aluminum (LiF/Al), aluminum (Al), silver (Ag), magnesium (Mg), or gold (Au). The common electrode 730 may become the cathode of the organic light emitting diode OLED. In the common electrode 730, a transmitting part 731 positioned corresponding to the transmitting window 352 may be formed. The transmitting part 731 may improve the external light transmittance along with the transmitting window 352. The pixel electrode 710, the organic emission layer 720, and the common electrode 730 may configure the organic light emitting diode OLED.

In an embodiment, the thin film encapsulation layer 300 as a layer formed to protect the organic light emission display layer 200 from external moisture may include a plurality of organic layers and inorganic layers that are deposited.

The quantum dot layer 400 may color-shift the color of a first wavelength range shown, e.g., represented, by the substrate 110, while the quantum dot layer 400 may show, e.g., represent, a color of a second wavelength range. In one embodiment, the first wavelength range may be 570 nm to 590 nm, and the second wavelength range may be 450 nm to 495 nm. The quantum dot layer 400 may form the color of the light passing through the quantum dot layer 400 to be transparent, e.g., white. As described above, by forming the quantum dot layer 400 that may shift the color on the substrate 110 including the colored polymer having the excellent heat resistance characteristic, the color of the light passing through the quantum dot layer 400 may be transparent, e.g., white, and the transparent organic light emitting diode display may be realized even though the substrate 110 may include the colored polymer. For example, light entering the display at the substrate 110 side may appear substantially the same when exiting at the protection layer 500 side.

Such a quantum dot layer 400 may include a plurality of quantum dot particles 410 made of a compound including, for example, Cd, Se, Zn, or S, and a size, e.g., diameter, of the quantum dot particles 410 may be less than 2 nm. A quantum dot layer 400 having quantum dot particles 410 having this material, e.g., Cd, Se, Zn, or S, and size may emit a blue color that is the second wavelength range of 450 nm to 495 nm. The quantum dot particles 410 of the quantum dot layer 400, or the quantum dot layer 400 itself, may not substantially interfere with, e.g., distort or alter, an image displayed by the organic light emission display layer 200.

Figure 6:
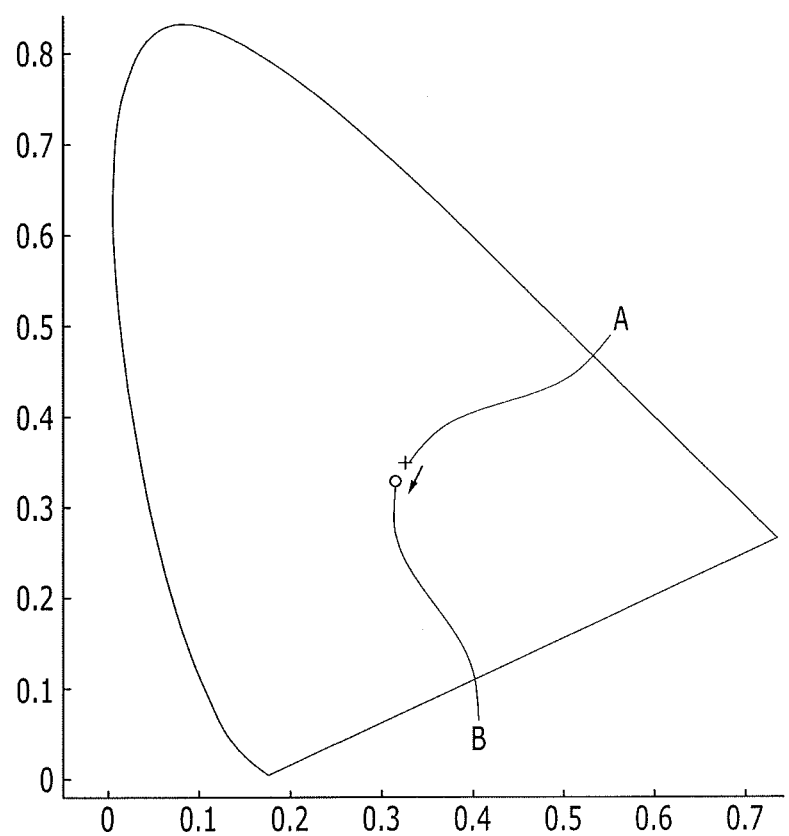
FIG. 6 illustrates a graph of a color shift on a CIE 1931 color space chromaticity distribution table in a case of applying an organic light emitting diode display according to an exemplary embodiment.

FIG. 6 illustrates a graph of a color shift on a CIE 1931 color space chromaticity distribution table in a case of applying an organic light emitting diode display according to an exemplary embodiment.

As shown in FIG. 6, the substrate 110 including the colored polymer may show, e.g., represent, the color (yellow) of the first wavelength range of 570 nm to 590 nm, and a color coordinate of A may be (0.333, 0.366), e.g., yellow. In the organic light emitting diode display of the present disclosure, by forming the quantum dot layer 400, the color coordinate of A of (0.333, 0.366) may be color-shifted into a position B that is the color coordinate of the transparent, e.g., white, color.

By way of summation and review, an organic light emitting diode (OLED) may be degraded by external factors such as external moisture and oxygen or ultraviolet (UV) rays such that packaging, e.g., encapsulating, the organic light emitting diode (OLED) may be important. To be applied to various applications, the organic light emitting diode (OLED) display may be required to be thin or to be easily bent. A thin film encapsulation (TFE) technique may allow bending of an organic light emitting diode (OLED) display with a thin thickness while encapsulating the organic light emitting diode (OLED). The thin film encapsulation (TFE) technique may include covering the display area with the thin film encapsulation layer by alternately depositing at least one organic layer and at least one inorganic layer on the organic light emitting diodes (OLED) formed at the display area of the display substrate.

A colored polymer substrate may be used in a flexible organic light emitting diode display that may be bent. The colored polymer substrate may form a charge transfer complex (CTC), a heat resistance characteristic and a mechanical characteristic may be excellent, and an organic light emitting diode display applied with, e.g., including, the colored polymer substrate may be processed at a process temperature of more than 450° C.

However, the charge transfer complex (CTC) may absorb a wavelength of a visible ray region, and the colored polymer substrate may have a yellow index in a 25-30 range after a coating and hardening process. As described above, it may be difficult to realize a transparent organic light emitting diode display by using a colored polymer substrate having a yellow index.

To realize a transparent organic light emitting diode display, a transparent polymer substrate suppressing formation of the charge transfer complex CTC may be used. However, for the transparent polymer substrate, since a π electron density may be reduced inside a polymer chain by an action group having strong electronegativity such as —$CF_3$ and —$SO_2$, a bulky group may be introduced inside the polymer chain, and steric hindrance may be generated. Accordingly, in an organic light emitting diode display applied with, e.g., including, the transparent polymer substrate, the heat resistance characteristic may be decreased according to the formation suppression of the charge transfer complex (CTC). Accordingly, for an organic light emitting diode display applied with, e.g., including, a transparent polymer substrate, it may be difficult to perform the process at a process temperature of more than 400° C.

The present disclosure provides an organic light emitting diode display that may be transparent and simultaneously may have an excellent heat resistance characteristic.

According to an exemplary embodiment, by forming the color-shifting quantum dot layer on the substrate including the colored polymer having the excellent heat resistance characteristic, the color of the light passing through the quantum dot layer may be transparent.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
a substrate that includes a colored polymer;
an organic light emission display layer on the substrate; and
a quantum dot layer on the organic light emission display layer,
the substrate having a color of a first wavelength range, and the quantum dot layer color-shifting the color of the first wavelength range to a color of a second wavelength range such that the first wavelength range and the second wavelength range together combine to form a white light, wherein the first wavelength range is 570 nm to 590 nm, and the second wavelength range is 450 nm to 495 nm.

2. The organic light emitting diode display as claimed in claim 1, wherein the quantum dot layer includes a quantum dot particle that includes Cd, Se, Zn, or S.

3. The organic light emitting diode display as claimed in claim 2, wherein the quantum dot particle has a diameter of less than 2 nm.

4. The organic light emitting diode display as claimed in claim 1, further comprising a protection layer on the quantum dot layer, the protection layer protecting the quantum dot layer.

* * * * *